(12) United States Patent
Kimura et al.

(10) Patent No.: US 6,271,709 B1
(45) Date of Patent: Aug. 7, 2001

(54) GATE DRIVE CIRCUIT OF VOLTAGE DRIVE SWITCHING ELEMENT

(75) Inventors: Shin Kimura, Hitachi; Masahiro Nagasu; Satoru Inarida, both of Hitachinaka; Hideki Miyazaki, Hitachi; Katsunori Suzuki, Takahagi, all of (JP)

(73) Assignee: Hitachi, LTD, Tokyo (JP)

( * ) Notice: Subject to any disclaimer, the term of this patent is extended or adjusted under 35 U.S.C. 154(b) by 0 days.

(21) Appl. No.: 09/453,204

(22) Filed: Dec. 3, 1999

(30) Foreign Application Priority Data

Dec. 3, 1998 (JP) .................................................. 10-343813

(51) Int. Cl.$^7$ .................................................. H03K 17/16
(52) U.S. Cl. .................. 327/380; 327/381; 327/387; 327/434; 327/170
(58) Field of Search .................................. 327/170, 205, 327/374, 380, 381, 387, 434

(56) References Cited

U.S. PATENT DOCUMENTS

| | | | |
|---|---|---|---|
| 4,779,013 | * | 10/1988 | Tanaka .................................. 327/374 |
| 4,814,638 | * | 3/1989 | Weick .................................... 326/82 |
| 4,985,644 | * | 1/1991 | Okihara et al. ........................ 326/83 |
| 5,099,138 | * | 3/1992 | Fukunaga .............................. 327/375 |
| 5,767,728 | * | 6/1998 | Michail et al. ....................... 327/374 |
| 5,808,504 | | 9/1998 | Chikai et al. . | 
| 5,936,387 | | 8/1999 | Tabata et al. ......................... 327/380 |

FOREIGN PATENT DOCUMENTS

| | | |
|---|---|---|
| 1-183214 | 7/1989 | (JP) . |
| 3-93457 | 4/1991 | (JP) . |
| 6-291631 | 10/1994 | (JP) . |
| 8-186976 | 7/1996 | (JP) . |
| 8-322240 | 12/1996 | (JP) . |
| 100150764 | 6/1998 | (JP) . |

* cited by examiner

*Primary Examiner*—Terry D. Cunningham
(74) *Attorney, Agent, or Firm*—Antonelli, Terry, Stout & Kraus, LLP

(57) ABSTRACT

A gate drive circuit of a voltage drive switching element, which is characterized by control of di/dt and dv/dt when an IGBT is switched by controlling increases in the switching time and loss of the IGBT, includes a drive means for amplifying a signal for controlling the switching operation of a voltage drive switching device including the IGBT, a means for detecting the gate voltage of the IGBT, a voltage decrease (increase) means for slowly decreasing (increasing) the output voltage when the drive means is turned on (off) in the course of time, and a voltage increase (decrease) means for slowly increasing (decreasing) the output voltage. By switching from the voltage decrease (increase) means to the voltage increase (decrease) means according to the detected value of the gate voltage of the IGBT, di/dt and dv/dt are controlled when the IGBT is turned on (off).

13 Claims, 9 Drawing Sheets

GATE DRIVE CIRCUIT OF VOLTAGE DRIVE SWITCHING ELEMENT

BACKGROUND OF THE INVENTION

The present invention relates to a gate drive circuit for a voltage drive switching element, such as an FET or IGBT.

FIG. 9 shows an example of the general circuit composition of a voltage invertor using an IGBT (insulated gate bipolar transistor). By turning an IGBT constituting three vertical series arms on or off alternately, AC power can be supplied from a DC power source E to a motor which operates as a load. In the drawing, Ls indicates a stray inductance of the main circuit cable. Progress has been made recently in the invertor mounting art such that the value of Ls, which is conventionally close to 1 $\mu$H, can be reduced to a value less than 150 nH. As a result, the energy accumulated in the stray inductance Ls is smaller, so that a snubber circuit (for example, as seen in FIG. 10) for controlling a spike voltage at the switching time is not necessary, and simplification of the main circuit can be realized.

However, the stray inductance Ls of the main circuit cable plays a role in the determination of di/dt at the time of power ON, and the snubber circuit (for example, as seen in FIG. 10) plays a role in controlling dv/dt at the time of power OFF, so that a new problem arises in that a high di/dt and a high dv/dt are generated at the time of switching of the IGBT due to the simplification of the main circuit.

The generation of a high di/dt and high dv/dt during the switching operation of the invertor circuit not only causes malfunctions of the peripheral equipment, but also adversely affects the motor which operates as a load. For example, in an invertor for a car, a motor which operates as a load is often installed at a location distant from the invertor. In the motor cable, the stray capacity Cs', indicated by dashed lines in FIG. 9, is included in addition to the inductance Ls'. Therefore, as dv/dt of the invertor increases, the impedance of the motor appears to be large, so that a resonance produced by Ls' and Cs' is generated. As a result, a voltage close to two times the output voltage of the invertor is applied to the motor, and this may cause a failure, such as dielectric breakdown of the motor. In view of this problem, it is important to control di/dt and dv/dt at the time of switching of the IGBT.

It is known that the switching speed for turning the IGBT, which is a voltage drive switching element, on or off can be controlled by the gate drive method, for example, by increasing the gate resistance and prolonging the charging time constant of the gate capacity of the IGBT. However, by using this method, the switching time is made longer and the loss by the IGBT is excessively large. Accordingly, an improvement wherein the gate resistance of the gate drive circuit is switched according to the switching timing of the IGBT has been proposed (Japanese Patent Application Laid-Open 1-183214, Japanese Patent Application Laid-Open 3-93457, Japanese Patent Application Laid-Open 6-291631, Japanese Patent Application Laid-Open 8-322240, Japanese Patent Application Laid-Open 10-150764, U.S. Pat. No. 5,936,387, U.S. Pat. No. 5,808,504 etc.).

Furthermore, in the Institute of Electrical Engineers of Japan, EDD-94-44, SPC-97-71, pages 13 to 18 and Japanese Patent Application Laid-Open 8-186976, it is suggested that di/dt can be suppressed by detecting di/dt and switching the gate resistance of the gate drive circuit.

However, when it is attempted to widen the variable range of di/dt and dv/dt by switching the gate resistance, many resistors and switches for changing over the range are required, and the control becomes complicated.

SUMMARY OF THE INVENTION

The object of the present invention is to control di/dt and dv/dt at the time of switching by controlling an increase in the switching time or a loss of a voltage drive switching element, such as an IGBT.

According to the present invention, when turning a voltage drive switching element on, a drive means for amplifying a signal for controlling the switching operation of the voltage drive switching element, a means for detecting the operation status (main voltage, or main current, or gate voltage) of the voltage drive switching element, a power decrease means for slowly decreasing the output power when turning the drive means on in the course of time, and a power increase means for slowly increasing the output power are provided, and by switching from the power decrease means to the power increase means according to a detected value of the operation status of the voltage drive switching element, the di/dt control amount can be changed when turning the voltage drive switching element on.

Further, according to the present invention, when turning a voltage drive switching element off, a drive means for amplifying a signal for controlling the switching operation of the voltage drive switching element, a means for detecting the operation status (main voltage, or main current, or gate voltage) of the voltage drive switching element, a power decrease means for continuously decreasing the output power when turning the drive means on in the course of time, and a power increase means for continuously increasing the output power are provided, and by switching from the power decrease means to the power increase means according to a detected value of the operation status of the voltage drive switching element, the di/dt control amount can be changed when turning the voltage drive switching element off.

Further, according to the present invention, a drive means for amplifying a signal for controlling the switching operation of a voltage drive switching element, a means for detecting the operation status (main voltage, or main current, or gate voltage) of the voltage drive switching element, a means for continuously decreasing or increasing the output power when turning the drive means on or off in the course of time, a detection means for detecting the temperature of the voltage drive switching element, and a means for converting the temperature detection amount to a voltage are provided, and by changing the switching timing from the power decrease means of the drive means to the power increase means or from the power increase means to the power decrease means according to a detected value of the operation status (main voltage, or main current, or gate voltage) of the voltage drive switching element and the temperature detection amount of the voltage drive switching element, and by making the power increase period shorter than the power decrease period, the di/dt control amount can be changed when turning the voltage drive switching element on or off.

Furthermore, according to the present invention, the power increase means and power decrease means are realized by a simple circuit, such as a parallel or serial arrangement of a resistor, capacitor, and switching element.

DETAILED DESCRIPTION OF THE PREFERRED EMBODIMENTS

Figure 1:
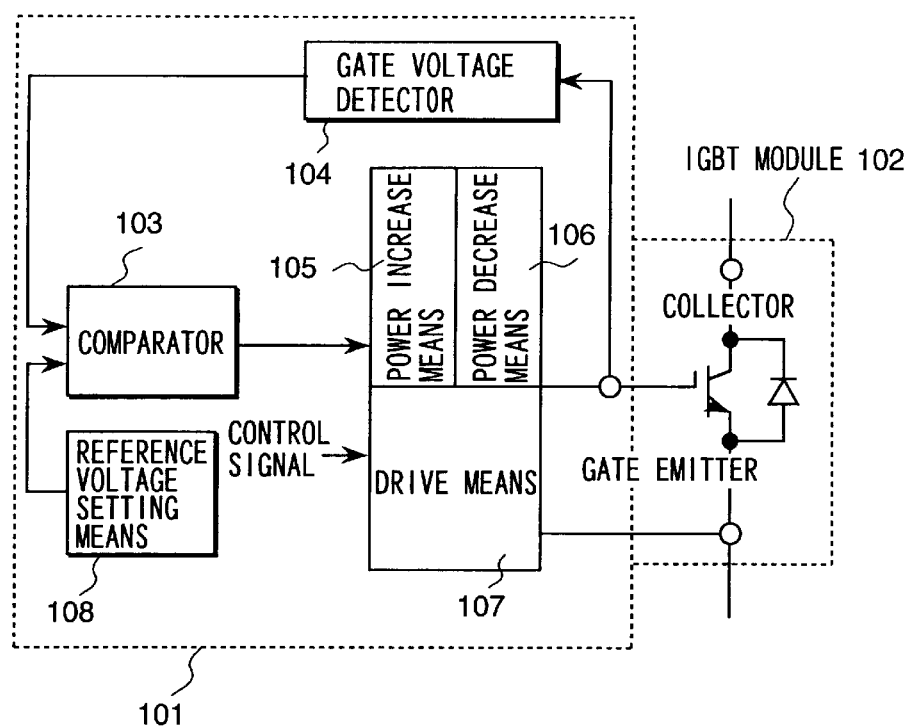
FIG. 1 is a block diagram of a gate drive circuit for a voltage drive element according to an embodiment of the present invention.
Figure 9:
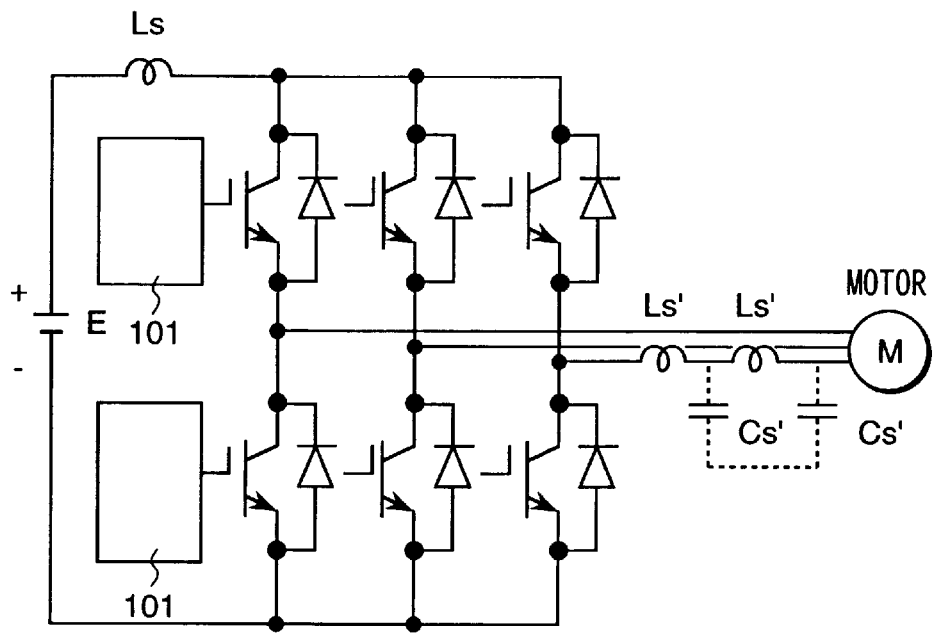
FIG. 9 is a circuit diagram of a voltage invertor to which an IGBT of the present invention is applied.
Figure 10:
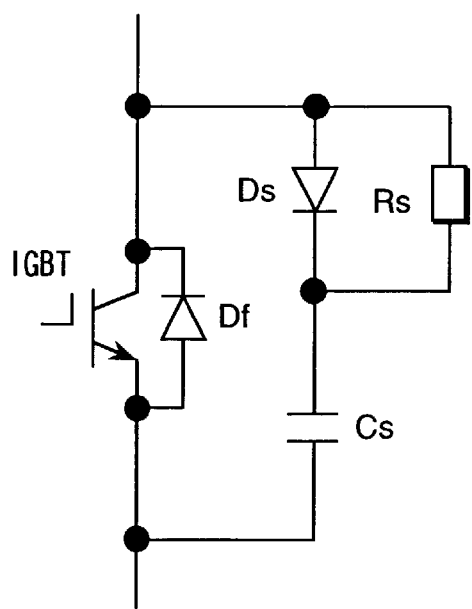
FIG. 10 is a circuit diagram of a snubber circuit for controlling a spike voltage.

FIG. 1 is a block diagram of a gate drive circuit 101 for an IGBT according to an embodiment of the present invention. An IGBT module 102, to which the gate drive circuit 101 is connected, is, for example, one element constituting a power converter, such as shown in FIG. 9. The output of a drive means 107, for amplifying a signal for controlling the turning of the IGBT on or off, is connected between the IGBT gate and the emitter thereof, and, a power increase means 105 and a power decrease means 106, for transitionally changing the output power thereof, are connected to the drive means 107 in series. Switching from the power decrease means to the power increase means is executed according to the operation status (collector voltage or collector current or gate voltage) of the IGBT. In this case, the switching is executed when the gate voltage is more than a reference voltage set by a reference voltage setting means 108. The operation of the gate drive circuit 101 will be explained in more detail hereunder with reference to the operation waveform of the IGBT. In the drawing, numeral 103 indicates a comparator and 104 indicates a gate voltage detector.

Figure 2A:
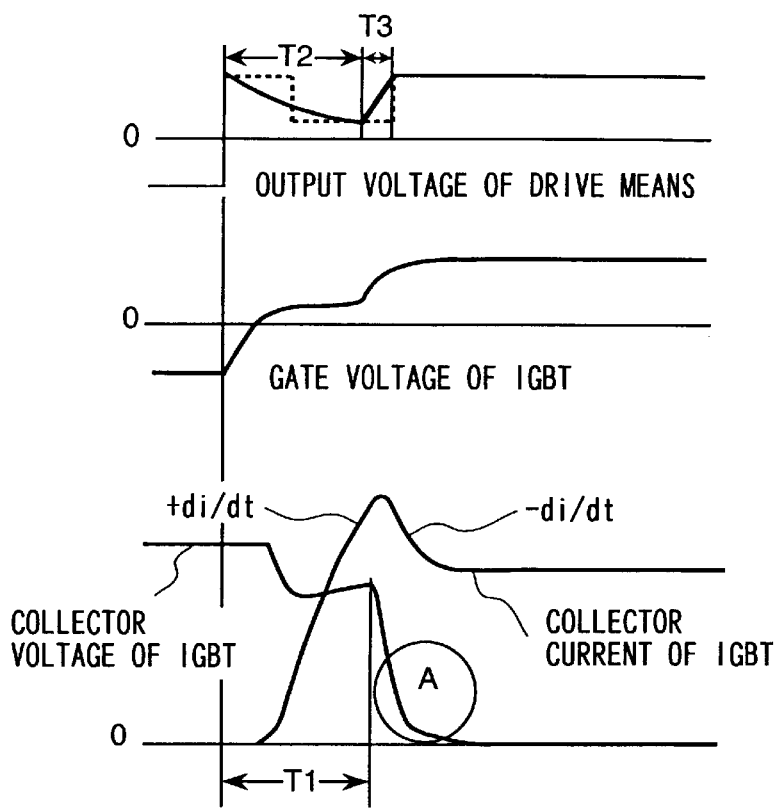
FIGS. 2A and 2B are is a turn-on operation waveform diagrams for explaining the operation of the embodiment of the present invention shown in FIG. 1.
Figure 2B:
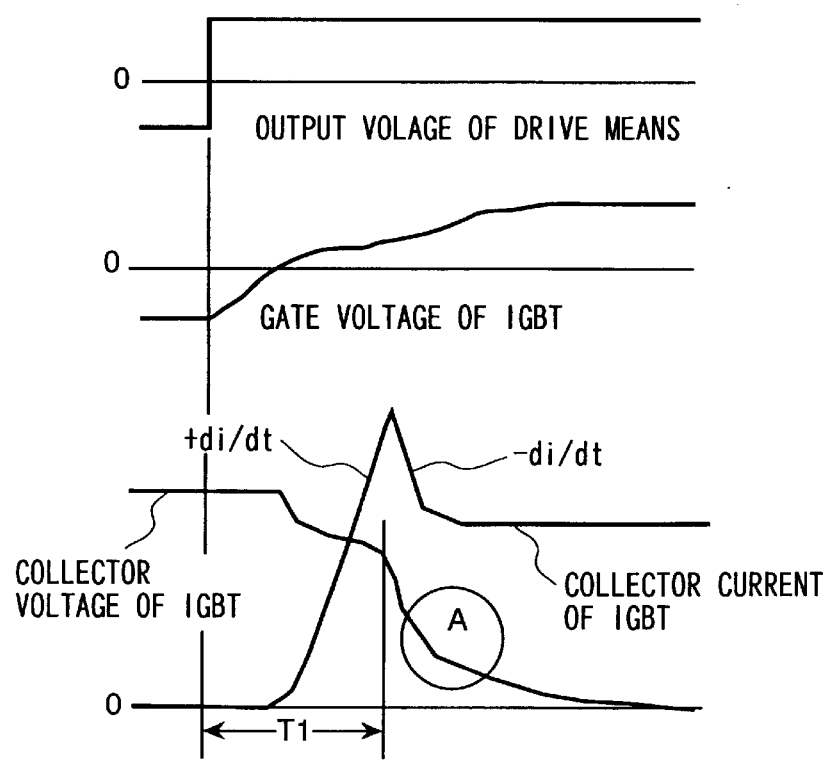
Figure 3A:
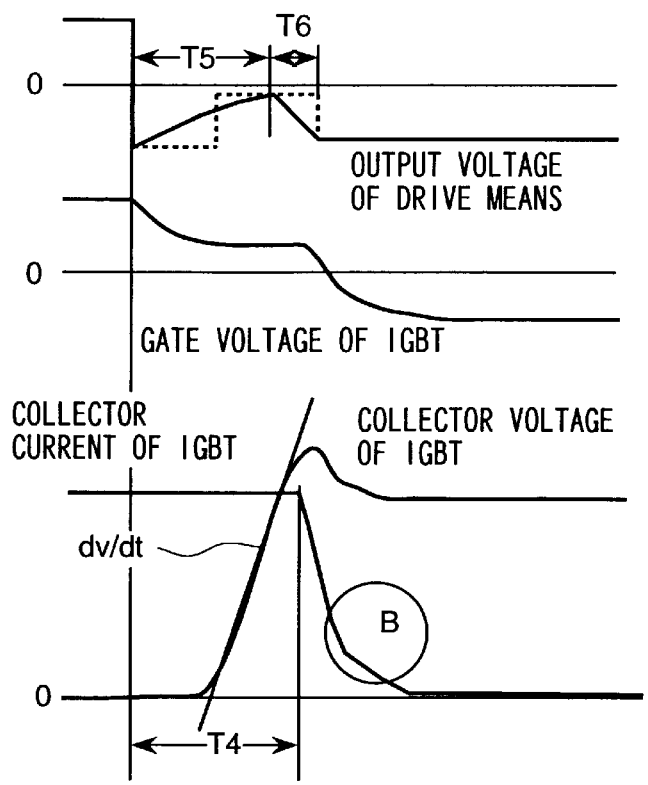
FIGS. 3A and 3B are turn off operation waveform diagrams for explaining the operation of the embodiment of the present invention.
Figure 3B:
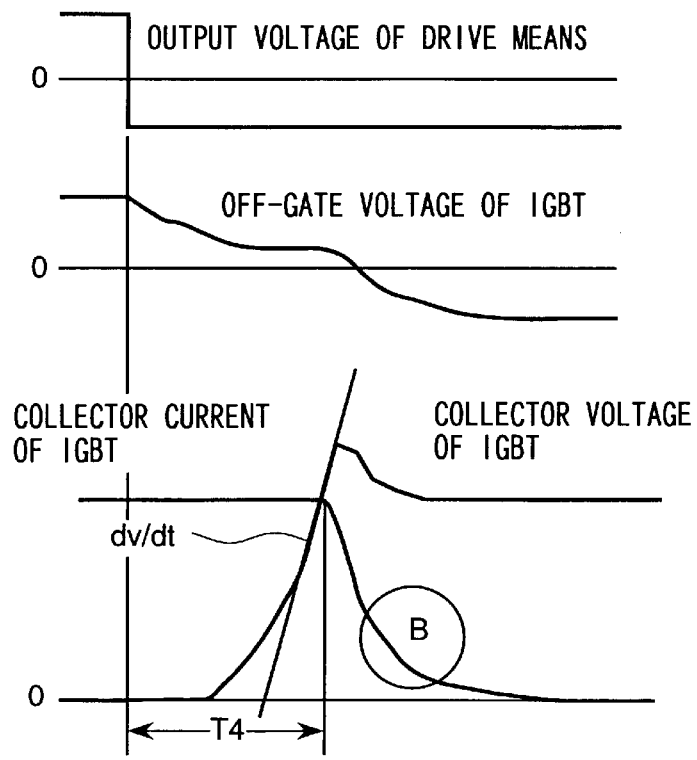

FIGS. 2A and 2B also show an example of IGBT turn-on operation waveforms, and FIGS. 3A and 3B show an example of IGBT turn off operation waveforms. FIGS. 2A and 3A show examples wherein the power increase means and power decrease means of the present invention are used, and FIGS. 2B and 3B show conventional examples the gate resistance is just increased and di/dt and dv/dt are controlled. In response to a signal from the controller, when the output voltage of the drive means is changed from negative to positive or from positive to negative, the switching operation of the IGBT is performed. However, FIG. 2A, which relates to the turn-on operation, will be mainly explained hereunder. In the drawing, a waveform which is referred to as an output capacity of the gate drive means is indicated. The reason for this will be described below.

Figures 8A, 8B:
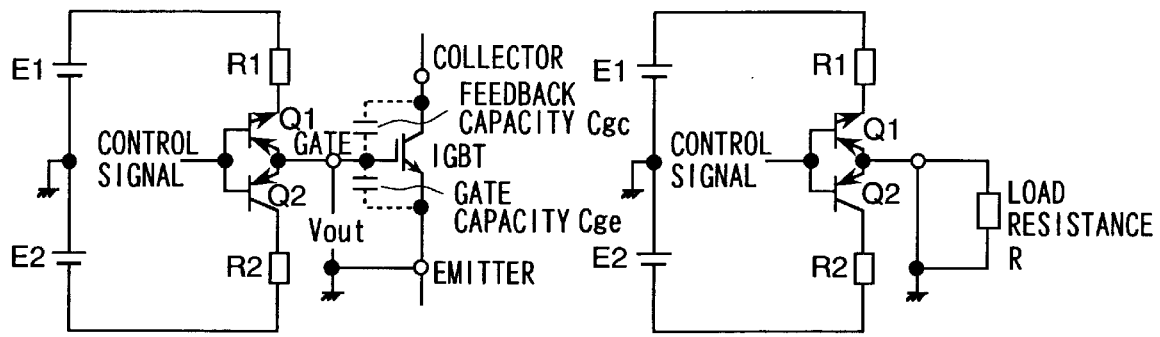
FIGS. 8A and 8B are circuit diagrams and FIGS. 8C and 8D are operation waveform diagrams for explaining the output capacity of a gate drive circuit for a voltage drive element.
Figure 8C:
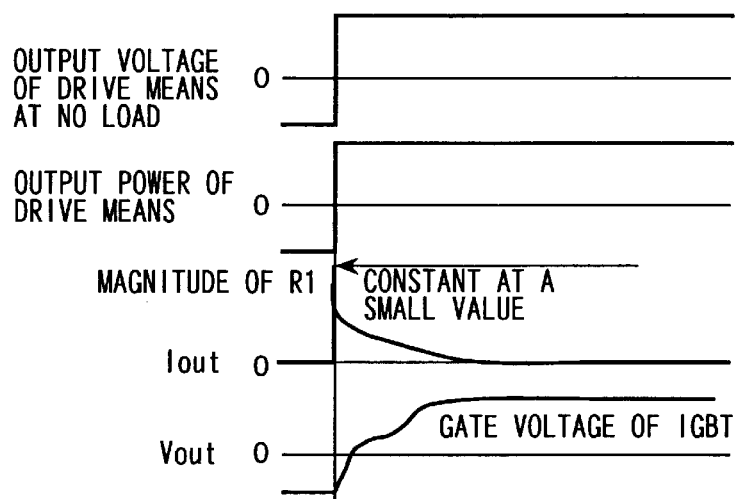

In FIGS. 8A to 8D, the gate drive circuit 101 of the IGBT and examples of operation waveforms are shown. R1 indicates a restricted resistance of the on gate current, and R2 indicates a restricted resistance of the off gate current. When turned on, Q1 is in the on state, and Q2 is in the off state, so that E1 is applied between the IGBT gate and the emitter via R1 and Q1. When turned off, Q1 is in the off state, and Q2 is in the on state, so that E2 is applied between the IGBT gate and the emitter via R2 and Q2. The load of the gate drive means, which is a voltage drive element, is a capacitive load having the collector feedback capacity Cgc and the gate capacity Cge, as shown by dashed lines in FIG. 8A. Therefore, when the gate drive means of the present invention is described as being in a state wherein the IGBT gate and emitter are connected, there is a part in the representation method which may be easily confused. For example, FIG. 8C shows the gate current Iout and the gate voltage Vout when the on gate resistance RI is changed with time and the drive power is changed with time.

Figure 8D:
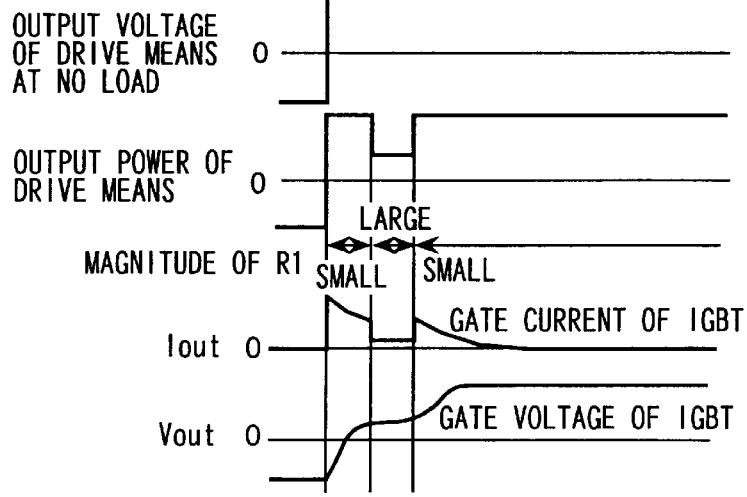

However, as shown by the gate current in FIGS. 8C and 8D, it is not easily determined how the condition of the gate drive means is changed. Even if the output power of the gate drive means is constant, there is a period during which the gate current Iout continuously decreases. The reason for this is that a capacitance load is connected to the gate drive means. To distinguish this point from the power decrease means of the present invention, the load resistance R is connected as shown in FIG. 8B, and the voltage added to the load resistance R is represented as the output power (output capacity) of the gate drive means. The voltage of the load resistance R in this case is determined by the ratio of it to the on resistance R1 or off resistance R2. Therefore, the value of the load resistance R is not restricted, though by selecting a value equivalent to R1 or R2, the change of the capacity of the gate drive means is more understandable.

In the conventional example shown in FIG. 2B, a constant positive voltage is output, while, in the case of the present invention shown in FIG. 2A, a positive voltage is output at first, and then the output voltage slowly decreases with time and then increases again. It is known that di/dt, when the IGBT is turned on depends on the rate of increase of the gate voltage, and the example shown in FIG. 2B is equivalent to a case in which the gate resistance is made higher and the rate of increase of the gate voltage is made lower. In this case, the increase in the collector current is controlled, while the turn-on time (T1) is made longer, and the decrease in the collector voltage in the portion A after being turned on is delayed, so that there is a defect in that the switching loss of the IGBT is increased. In the case of FIG. 2A of the present invention, a large positive voltage is output at the beginning of turn-on, and the voltage slowly decreases with time, and then increases again with time after T2, and returns to the first voltage after T3. The first large output voltage increases the gate voltage of the IGBT with an increasing rate, and plays the roll of shortening the turn-on time(T1). When the gate voltage of the IGBT reaches the threshold value, the output voltage lowers and di/dt is controlled in the same way as with the case shown in FIG. 2B. Further, when the gate voltage of the IGBT is more than the threshold value, the output voltage is increased again, and the gate voltage increases quickly, and the collector voltage at the portion A shown in FIG. 2A decreases quickly, and the switching loss is reduced.

As mentioned above, the first characteristic of the present invention is that, when the IGBT is turned on, a large positive voltage is output at first and then slowly lowered with time, and, after a time, the voltage is increased again according to the operation status (the gate voltage in this case) of the IGBT, whereby the switching time is shortened and the turn-on loss is reduced, and softening of the switching speed of the IGBT is realized. However, the present invention has the following characteristics in contrast to the prior art.

As a method for shortening the turn-on and turn-off time, when software of the switching speed of the IGBT is realized and the switching loss is reduced, a method of switching the gate resistance (Japanese Patent Application Laid-open 1-183214, Japanese Patent Application Laid-Open 3-93457, Japanese Patent Application Laid-Open 6-291631) is proposed. The output voltage of the drive means when the gate resistance is switched is as shown by dashed lines in FIGS. 2A and 3A, and the same effect as that of the present invention is partially obtained. However, great differences are generated in the ease of control, the effect, and the constitution for the following reason. Realization of software of the switching speed of the IGBT essentially causes an increase in the switching loss, so that it is necessary to avoid realization of unnecessary software of the switching speed as much as possible. As described in Japanese Patent Application Laid-Open 6-291631, Japanese Patent Application Laid-Open 8-322240, and Japanese Patent Application Laid-Open 10-150764, although di/dt and dv/dt of the IGBT are also changed by the supply voltage and temperature during current supply, when it is attempted to control di/dt and dv/dt, by method of switching the gate resistance, many gate resistors and switching devices are necessary. According to method of switching the gate resistance, after di/dt and dv/dt of the IGBT are controlled, the gate resistance is switched to a small gate resistance during the time of the voltage increase period T3 (see FIGS. 2A and 3A) of the present invention. However, when the timing is early, di/dt and dv/dt suddenly increase on the way, and when the timing is excessively late, the switching loss increases, so that it is difficult to determine the proper timing for switching of the gate resistance.

According to the present invention, the power decrease means and power increase means for outputting a large positive voltage at first at the turn-on time and for changing it with time are provided. The power decrease means for slowly decreasing the voltage is equivalent to continuously switching the gate resistance to a large resistance in the case of using the method of switching the gate resistance. The power increase means for increasing the voltage with time again after the operation period T2 of the power decrease means is equivalent to continuously switching the gate resistance to a small resistance. Namely, shortening of the operation period T2 of the power decrease means and prolonging the operation period T3 of the power increase means are equivalent to making the gate resistance smaller, and prolonging the operation period T2 and shortening the operation period T3 are equivalent to making the gate resistance larger. By providing a function for continuously changing the gate resistance equivalently like this and by controlling the timing for switching from the power decrease means to the power increase means, the sudden change of di/dt and dv/dt can be controlled. For example, in the case of the IGBT of 3.3 kV and 1200 A used for our experiment, when the IGBT was turned on at about 100 nH of inductance of the main circuit and 2 kV of supply voltage, the turn-on time lag Td from output of the gate drive means to the start of flow of the main current of the IGBT was about 1.5 $\mu$s, and di/dt at startup of the main current was about 6000 A/$\mu$s.

In this case, the operation period T until the main current rised up to 1200 A was as follows:

$T$=rated current (1200 A)/controlled $di/dt$ (6000 A/$\mu$s)=0.2 $\mu$s

In this case, T1=about 1.7 $\mu$s. In such a case, when the increase period T3 of the power increase means is set to more than 0.2 $\mu$s, it was found that, since the decrease period T2 of the power decrease means is equal to Td+T=1.5 $\mu$s+0.2 $\mu$s, di/dt can be controlled within the range of T2=Td+T−T3.

However, when T3=Td+T, T2 becomes 0, the power decrease means does not operate, so that it is excluded. Actually, for the turn-on time lag Td from the output of the gate drive means to the start of flow of the main current of the IGBT, the rise period T of the main current is short, so that it is effective to control di/dt with a relation of T2>T3.

As mentioned above, according to the present invention, by changing the operation point T2 from decrease to increase by combining the power decrease means continuously decreasing and the power increase means continuously increasing, di/dt can be changed. This also means that there is an effect that the di/dt control amount does not change suddenly by a slight shift of the switching operation point T2.

As mentioned above, the main characteristic of the present invention is that the power decrease means and the power increase means function so as to continuously change the gate resistance equivalently. However, for example, even when the part (T2) of the power decrease means is used as a conventional method of switching the gate resistance, and the power increase means (corresponding to the period T3) of the present invention is combined, an advantage is achieved in that even if the timing (corresponding to the period T2) for switching the two is slightly shifted, di/dt and dv/dt do not change suddenly. The present invention is also characterized in that, since di/dt and dv/dt can be controlled by changing the operation point of the power increase means, it can be used to control di/dt and dv/dt when the power supply conditions (supply voltage, collector current, temperature, etc.) are changed.

In the above embodiments of the present invention, the turn-on operation of the IGBT has been explained representatively. However, as shown in FIG. 3A, the turn-off operation can also be controlled in the same way as with the turn-on operation. In the case of a voltage drive element, the on or off operation is performed at a boundary of the threshold value thereof and is controlled in the positive direction of the gate voltage, and there is a difference in whether it is controlled in the negative direction or not. A detailed explanation of the turn-off operation will be omitted, though another characteristic operation of the present invention which is not explained in the turn-off operation will be explained hereunder using the turn-off operation.

FIG. 3A shows waveforms related to an embodiment of the present invention and FIG. 3B shows an example of conventional operation waveforms of the IGBT when the gate resistance is increased and dv/dt is controlled. When the collector voltage waveforms of the two are compared, it is seen that, in the embodiment of the present invention shown in FIG. 3A, the voltage increasing inclination is almost constant, while in the case of FIG. 3B, the inclination is slight at first, but then gets more steep slowly. This operation is affected by the feedback capacity Cgc in the IGBT as seen by a dashed line in FIG. 8A. The current flows via the feedback capacity Cgc on the emitter side from the gate as the collector voltage increases at the time of turn-off and denies a part of the gate current, and hence functions so as to delay the turn-off operation. At the time of turn-on, it functions so as to cause a part of the collector current to flow on the collector side as the collector voltage lowers and to delay the turn-on operation. It is known that the feedback capacity Cgc is large when the collector voltage is low and becomes smaller by 2 digits or more as the collector voltage increases. When the IGBT is operated at a large gate current, the rate of current flowing via the feedback capacity is-small, while when the gate current is made smaller so as to control dv/dt, the rate of current flowing via the feedback capacity becomes larger. As a result, in the case of FIG. 3B, the voltage increases slowly at a location where the collector voltage is low.

On the other hand, in the case of FIG. 3A of the present invention, as previously described, the drive capacity is continuously changed by the power decrease means and a larger gate current is supplied at a location where the collector voltage is lower than that at a location where the collector voltage is high, so that the increase of the collector voltage is made almost uniform.

As mentioned above, according to the present invention, the increase of the collector voltage is almost equalized and an area of unnecessarily low dv/dt is not created, so that the increase of loss of the IGBT when dv/dt is controlled can be minimized.

Figure 4:
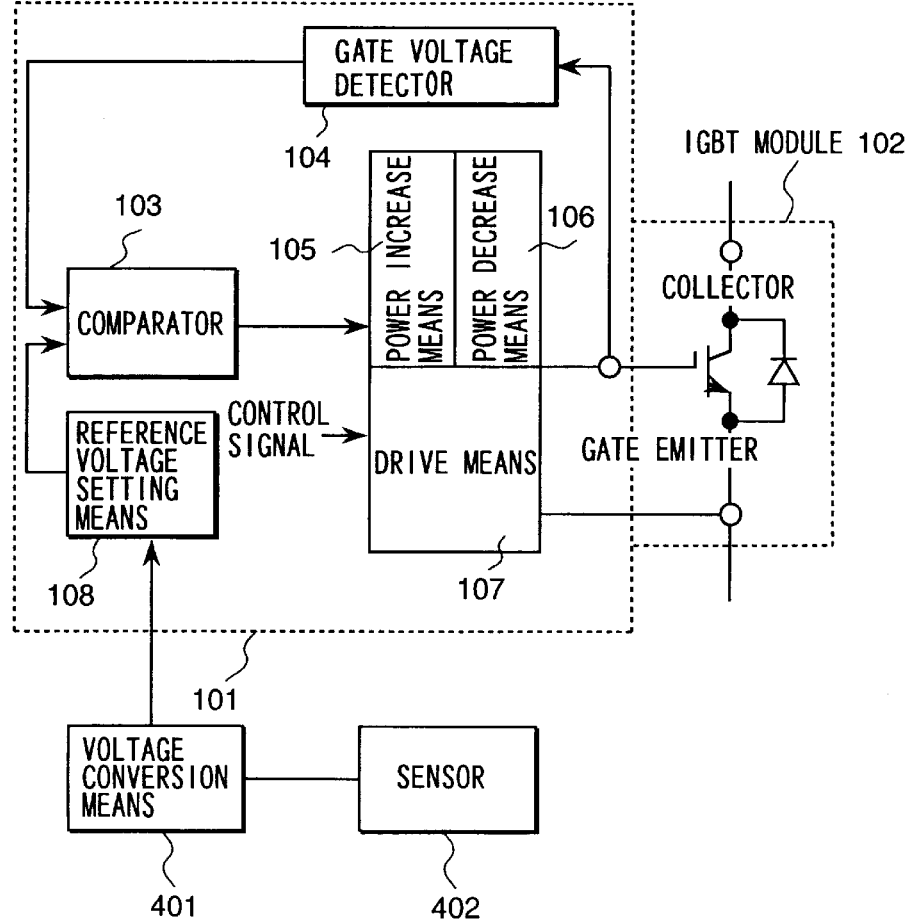
FIG. 4 is a block diagram of a gate drive circuit a voltage drive element according to another embodiment of the present invention.
Figure 11:
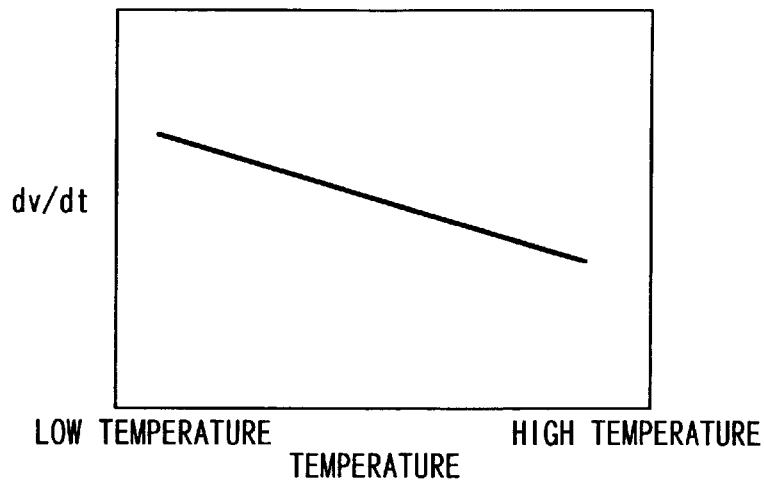
FIG. 11 is a characteristic diagram showing the temperature dependence of a dv/dt of an IGBT.

FIG. 4 shows a block diagram of the gate drive circuit 101 of the IGBT showing according to embodiment of the present invention. There are differences in this embodiment from that of FIG. 1 in that a sensor 402 for detecting the temperature is added and the sensor output is converted in voltage by a voltage conversion means 401 and used to control the reference voltage. As mentioned above, di/dt and dv/dt, when the IGBT of the IGBT module 102 is switched, will vary with the supply voltage, current, and temperature during power supply. For example, depending on the operation temperature of the IGBT, dv/dt at the time of turn-off is changed as shown in FIG. 11. Since this value greatly depends on the temperature, when the gate conditions are set at a low temperature, dv/dt is unnecessarily controlled at a high temperature and an increase of the turn-on loss may be caused.

According to this embodiment, by controlling the reference voltage using the output of the temperature sensor, the timing for switching from the operation period T5 of the power decrease means 106 to the operation period T6 of the power increase means 105 is changed. Namely, when the temperature is low, the operation period T5 of the power decrease means 106 is made longer, and as the temperature rises, the operation period T5 is made shorter. Reduction in the turn-off loss when the operation temperature rises is realized by equalizing dv/dt at the time of turn-off. An embodiment using the temperature dependency of di/dt and dv/dt is indicated above. However, when di/dt and dv/dt depend on physical quantities (for example, supply voltage, collector current), they can be controlled by the same method.

Figure 5:
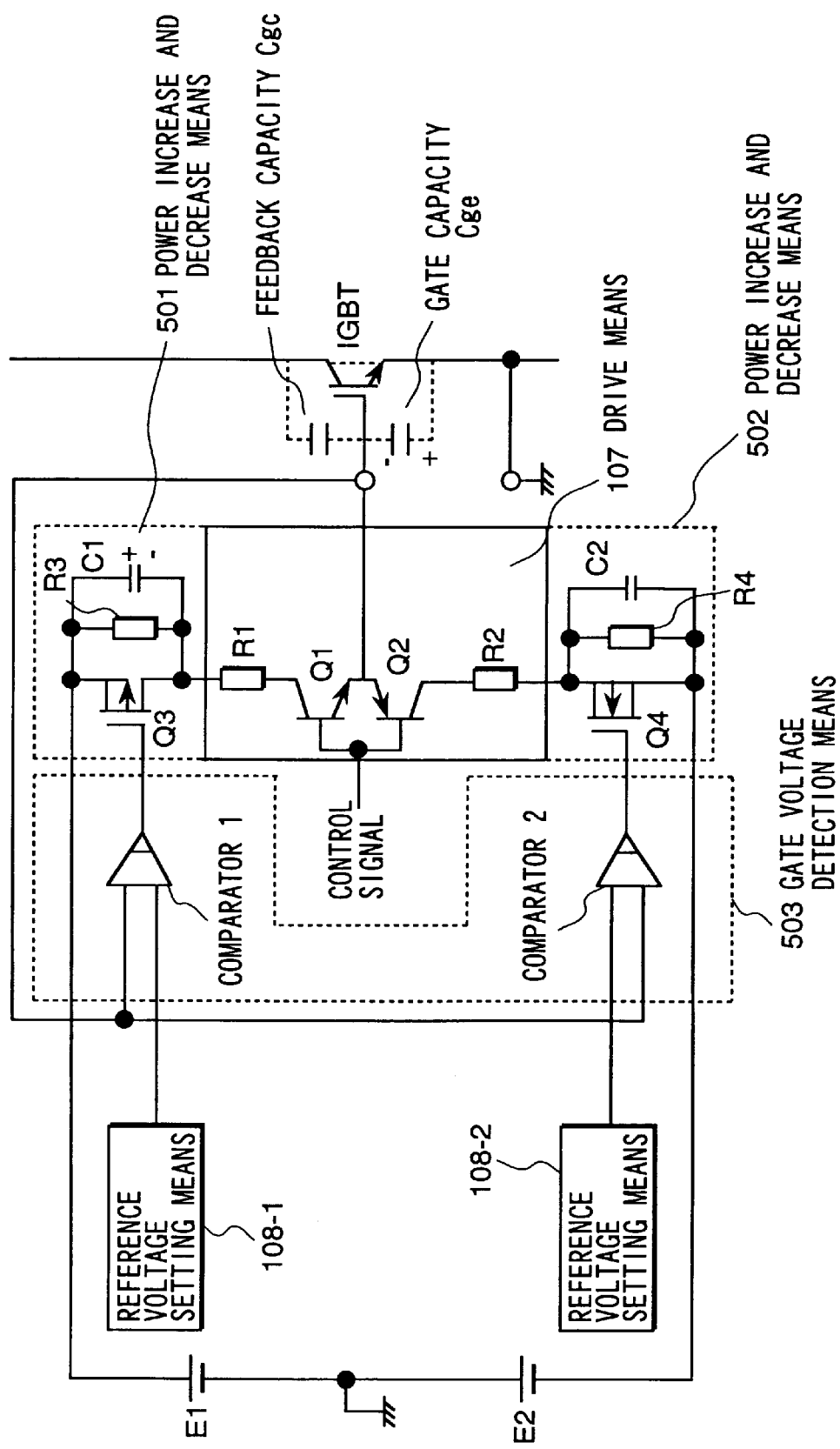
FIG. 5 is a circuit diagram of the embodiment of the gate drive circuit for a voltage drive element as shown in FIG. 1.

FIG. 5 shows an embodiment of the gate drive circuit 101 according to another embodiment of the present invention. Q1 and Q2, which are complementarily connected for amplifying a signal for controlling the switching operation of the voltage drive switching element, including the IGBT, and gate resistors R1 and R2 are connected in series, and voltage increase means 501 and voltage decrease means 502 also are connected to them in series. The power increase means 501 and the power decrease means 502 are structured so that capacitors C1 and C2, resistors R3 and R4, and switches Q3 and Q4, respectively, are connected in parallel. The gates of the switches Q3 and Q4 are connected respectively to the outputs of comparators 1 and 2 of a gate voltage detection means 503, and the operations of the comparators 1 and 2 are controlled by comparing the gate voltage of the IGBT with a reference voltage from reference voltage setting means 108-1 and 108-2 respectively. The turn-on operation is performed as indicated below. When Q1 and Q3 are changed to the off status, and Q1 is changed to the on status when Q1 and Q3 are in the off status and Q2 and Q4 are in the on status, the gate current flows via the path of the power source E1, (C1, R3), R1, Q1, and the gate emitter of the IGBT. At this time, the gate current flows in parallel with C1 and R3. However, since the gate capacity of the IGBT is almost reversely charged to the power source E2 first, a large gate current, depending on the power source E1, power source E2, and R1, flows through C1. The charging of the capacitor C1 advances rapidly, so that a current depending on the power source E1 and the resistances R1 and R3 is limited, and it plays the role of the power decrease means of the present invention.

Next, when the gate voltage increases and exceeds the reference voltage of the comparator 1, Q3 is turned on. When Q3 is turned on, the path of the gate current is changed to the path of the power source E1, Q3, R1, Q1, and the gate emitter of the IGBT, so that the present invention functions so as to increase the gate current and suddenly increase the gate voltage. However, immediately before Q3 is turned on, C1 is charged with the polarity shown in FIG. 5, and immediately after Q3 is turned on, the charge accumulated in C1 is discharged. The discharge in this case is executed according to the C1 capacity and Q3 time constant of on-resistance, and it plays a role of the power increase means of the present invention in correspondence with discharge of the capacitor C1. The operation at the time of turn-off is opposite to that at the time of turn-on, and the explanation thereof will be omitted. However, Q4, R4, and C2 play a role of the power decrease means and power increase means at the time of turn-off and the present invention is realized by a simple circuit configuration.

The capacitors C1 and C2 are also used to shorten the switching times T1 and T4. Before turning on the IGBT, the gate capacity Cge of the IGBT is charged to minus E2, so that the charge for charging it up to the gate threshold voltage Vth of the IGBT is as follows:

$$Qon = Cge \times (E2 + Vth) \quad (1)$$

and at the time of turn-off, the discharging charge from E1 to the gate threshold voltage Vth is as follows:

$$Qoff = Cge \times (E1 - Vth) \quad (2).$$

When the charges accumulated in C1 and C2 are made almost equal to the charges of Qon and Qoff during the power decrease period T2 at the time of turn-on and the power decrease period T5 at the time of turn-off, the switching time is greatly shortened. However, the decrease or increase in the gate voltage becomes slow and the di/dt and dv/dt control range at the time of switching of the LGBT becomes narrow. As shown in Formulas (1) and (2) mentioned above, Qon and Qoff themselves vary with the voltage of the gate circuit, though under gate circuit conditions of the IGBT of E1=15 V and E2=10 V used in our experiment, which seems to be standard, when the capacities of C1 and C2 are set to 1 to 5 times that of the gate capacity Cge of the IGBT, great effects are produced in both a shortening of the switching time and in the control of di/dt and dv/dt.

Figure 6:
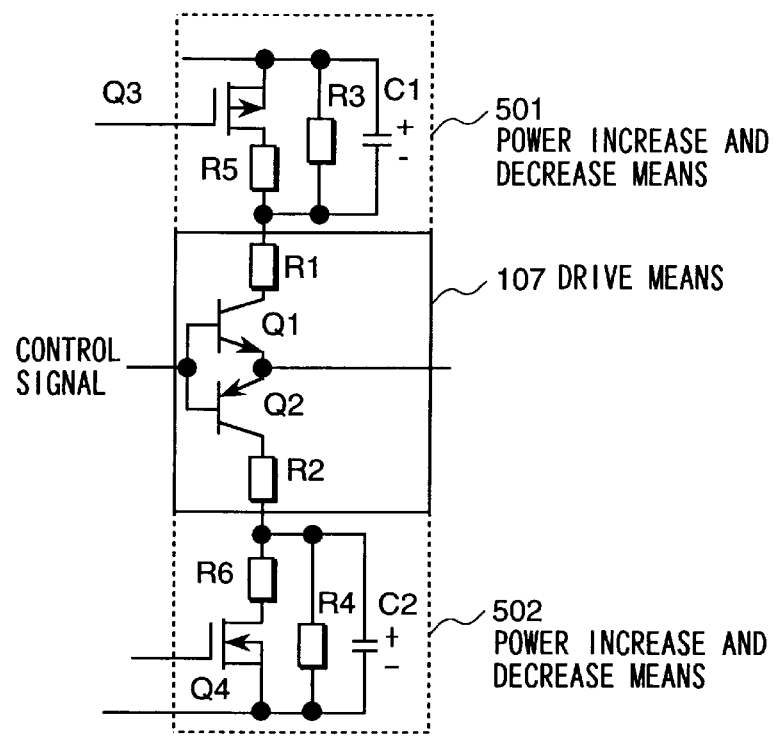
FIG. 6 is an example of a modification of the circuit shown in FIG. 5.

FIG. 6 shows another embodiment of the gate drive circuit of the IGBT according to the present invention. The difference between the power increase 501 and power decrease means 502 shown in FIG. 5 and the power increase means 501 and power decrease means 502 shown in FIG. 6 is that resistances R5 and R6 are provided in series with the switches Q3 and Q4, respectively. The on-resistances of the switches Q3 and Q4 can be changed by base input thereof This case is an example wherein the discharge time constant of C1 and C2 is made larger by adding the resistances R5 and R6, and the power-increase period T3 is changed.

Figure 13:
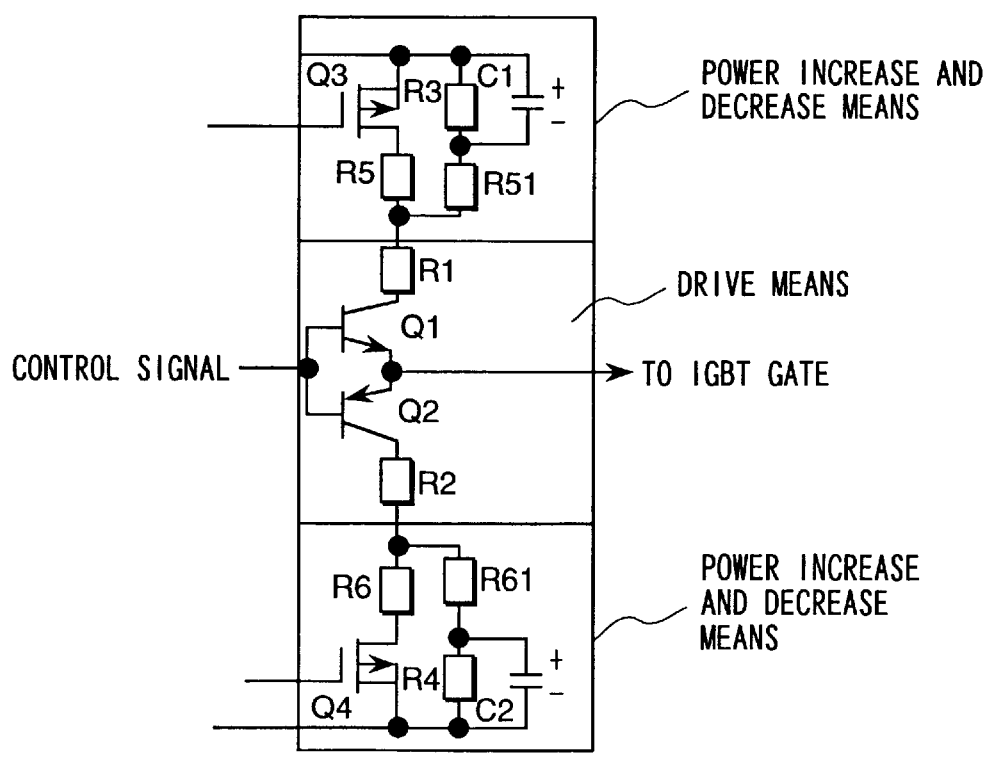
FIG. 13 is a circuit diagram showing an example of the circuit shown in FIG. 6.

FIG. 13 shows another embodiment of the gate circuit of the IGBT according to the present invention. The difference in this embodiment from that of FIG. 6 is that R51 is provided in series with R3 and C1, and R61 is provided in series with R4 and C2. When the switches Q3 and Q4 are turned on, both gate resistances are R1 and R5 at the time of turn-on and R2 and R6 at the time of turn-off When R5 and R6 are increased, R1 and R2 are decreased in correspondence to it. However, in the case shown in FIG. 6, when R1 and R2 are decreased, the currents flowing through R3 and C1 and also R4 and C2 are changed on a chain basis, so that the circuit design is complicated. In the embodiment shown in FIG. 13, resistors R51 and R61, equivalent to R5 and R6, are connected to R3 and C1 and also R4 and C2 in series, and the currents flowing through R3 and C1 and R4 and C2 are unchanged.

Figure 12:
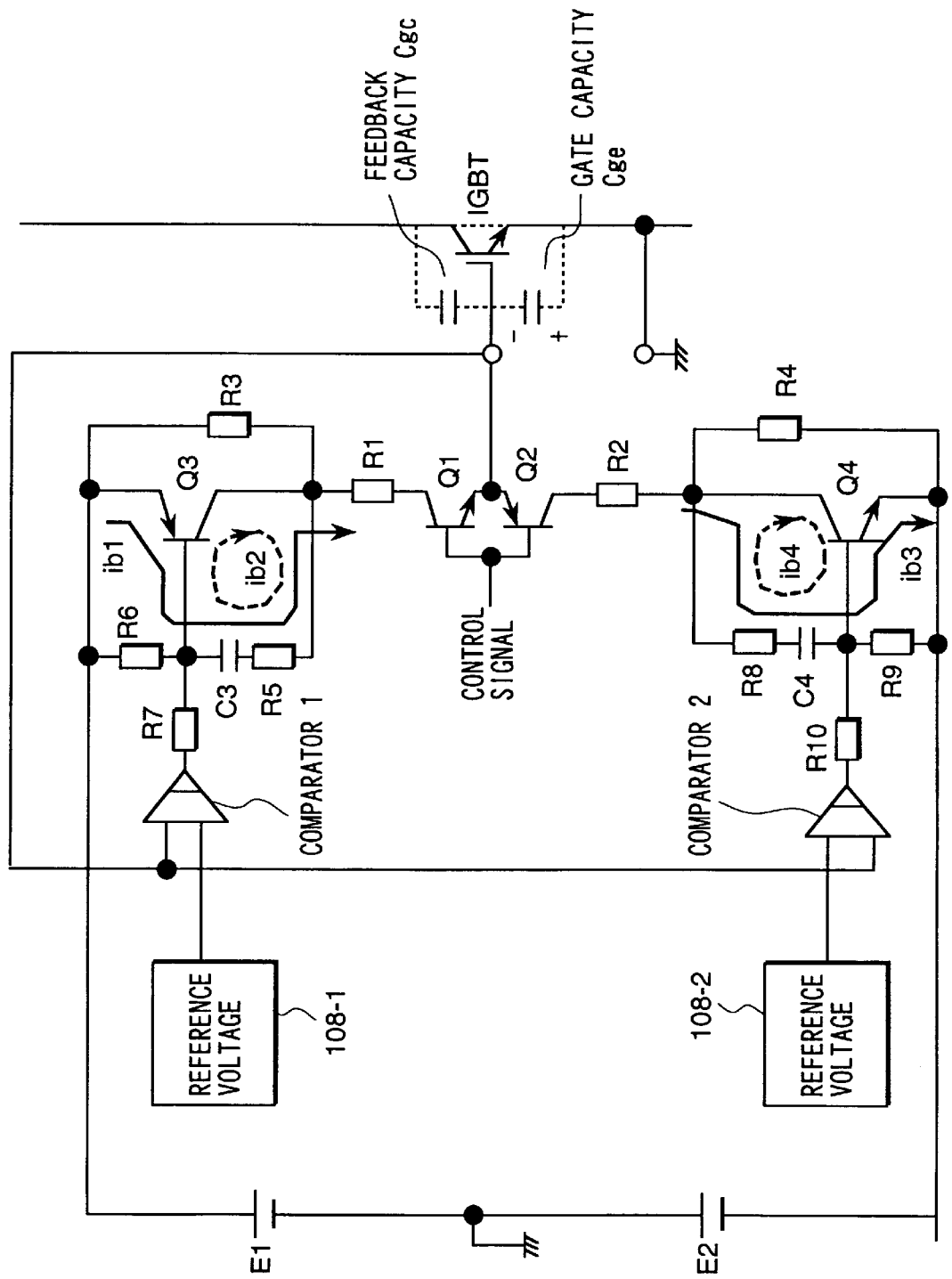
FIG. 12 is a circuit diagram showing an example of a modification of the embodiment shown in FIG. 5.

FIG. 12 shows another embodiment of the gate drive circuit of the IGBT according to the present invention. The difference from the power increase means and power decrease means shown in FIG. 6 is that changes in the base currents of the switches Q3 and Q4 are used. When the switch Q1 is turned on, the supply voltage E1 is applied in the path of R3, R1, and the gate of the IGBT. Then, by the voltage applied to R3, a base current ib1 of Q3 flows in the path of the Q3 emitter-base, C3, and R5, so that Q3 is turned on. However, when Q3 is turned on, the voltage applied to Q3 lowers and the base current ib1 does not flow, which the result that the current determined by the charging current of C3 and hfe of Q3 flows and plays the role of a power decrease means. Next, when the base current flows via R7 and Q3 is turned on, ib2 flows using C3 as a power source, so that the current flowing through R1 reduces during the period and plays the role of a power increase means. It is clear that the power decrease period T2 and the power increase period T3 in this case are changed by C3 and R5. As shown in FIG. 5, a capacitor C1 may be provided in parallel with Q3.

Figure 7:
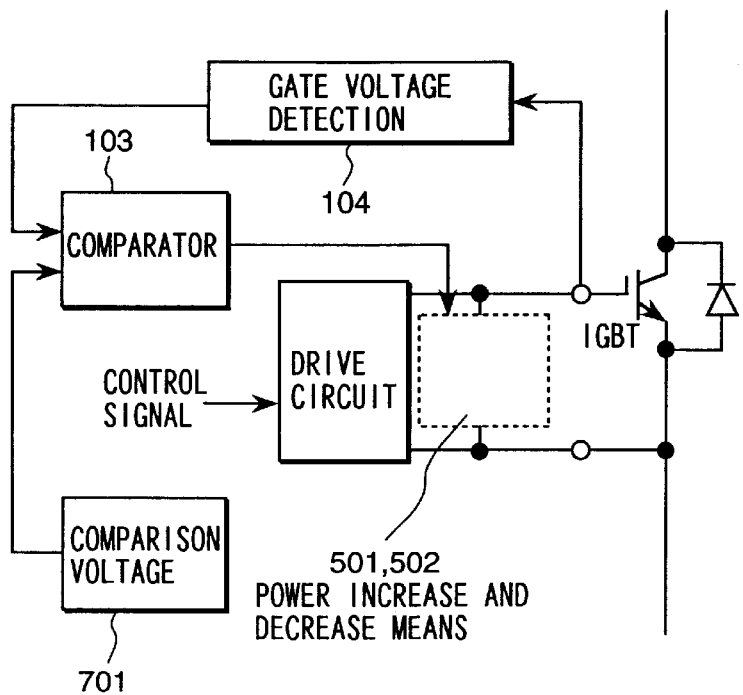
FIG. 7 is a block diagram of a gate drive circuit for a voltage drive element according to another embodiment of the present invention.

FIG. 7 is a block diagram of another embodiment of the gate drive circuit of the IGBT according to the present invention. In the embodiment shown FIG. 1, the power increase means 105 and the power decrease means 106 are connected to the drive means in series. However, in this embodiment, the power increase means 501 and power decrease means 502 are connected to the drive means 107 in parallel. By bypassing the output from the drive means by the power increase means 501 and the power decrease means 502, a decreasing and an increasing of the output power are realized. The operation is the same as that shown in FIG. 1 and so an explanation thereof will be omitted.

The present invention has explained above from the viewpoint of control of di/dt and dv/dt at the time of switching of a voltage drive switching element of an IGBT or FET. The gate drive circuit of the present invention is also effective in protection from an overcurrent generated by a load short-circuit or an arm short-circuit of a power converter. Namely, the reason for this is that the gate drive circuit is capable of controlling the reference voltage by the sensor output and can easily control an increase or decrease in the reference voltage by installing a temperature sensor and an overcurrent sensor in parallel with each other. The present invention can be applied to a case wherein, for example, when an overcurrent is detected at the time of turn-on, the reference voltage of the comparator is increased, and switching from the gate voltage decrease means to the increase means is avoided, and an overcurrent generated by a load short-circuit or an arm short-circuit of the power converter is prevented from increasing more.

As the above explanation shows, the present invention produces an effect such that not only is it possible to eliminate factors for causing malfunctions of the peripheral equipment due to high di/dt and high dv/dt of the circuit operation of an inverter using a voltage drive switching device, but also problems, such as dielectric breakdown of a motor operating as a load, can be solved.

What is claimed is:

1. A gate drive circuit of a voltage drive switching element comprising drive means for outputting an output power for controlling a gate voltage of said voltage drive switching element, a detector for detecting said gate voltage of said voltage drive switching element and providing an output indicative of said gate voltage, power decrease means, responsive to said output of said detector, for decreasing said output power in the course of a power decrease operation time when switching said voltage drive switching element, and power increase means, responsive to said output of said detector, for increasing said output power in the course of a power increase operation time when switching said voltage drive element, wherein the power decrease operation time of said power decrease means is larger than the power increase operation time of said power increase means.

2. A gate drive circuit of a voltage drive switching element according to claim 1, wherein said gate drive circuit has means for detecting temperature of said voltage drive switching element and means for converting said detected amount to a voltage and switching from said power decrease means for decreasing said output power of said drive means to said power increase means according to said temperature detected amount.

3. A gate drive circuit of a voltage drive switching element according to claim 1 or 2, wherein any or both of said power decrease means and said power increase means for respectively decreasing and increasing said output power of said drive means comprise a capacitor and a switching device provided in parallel.

4. A gate drive circuit of a voltage drive switching element according to claim 1 or 2, wherein any or both of said power decrease means and said power increase means for respectively decreasing and increasing said output power of said drive means comprise a resistor, a capacitor and a switching device provided in parallel or in series and parallel.

5. A gate drive circuit of a voltage drive switching element according to claim 3, wherein the capacitor capacity used by said power decrease means or said power increase means is 1 to 5 times the gate capacity of said voltage drive switching element.

6. A gate drive circuit of a voltage drive switching element according to claim 4, wherein the capacitor capacity used by said power decrease means or said power increase means is 1 to 5 times the gate capacity of said voltage drive switching element.

7. An inverter structured by using a plurality of voltage drive switching elements driven by said gate drive circuit defined in claim 1.

8. A gate drive circuit of a voltage drive switching element according to claim 1, wherein said voltage drive switching element comprises an IGBT.

9. A gate drive circuit of a voltage drive switching element comprising a drive circuit which outputs an output power to control a gate voltage of said voltage drive switching element, a detector which detects said gate voltage of said voltage drive switching element and provides an output indicative of said gate voltage, a power decrease circuit, responsive to said output of said detector, which decreases said output power in the course of a power decrease operation time when switching said voltage drive switching element, and a power increase circuit, responsive to said output of said detector, which increases said output power in the course of a power increase operation time when switching said voltage drive element, wherein the power decrease operation time of said power decrease circuit is larger than the power increase operation time of said power increase circuit.

10. A gate drive circuit of a voltage drive switching element according to claim 9, wherein said voltage drive switching element comprises an IGBT.

11. A gate drive circuit of a voltage drive switching element comprising a circuit which outputs an output power to control a gate voltage of said voltage drive switching element, a detector which detects said gate voltage of said voltage drive switching element and provides an output indicative of said gate voltage, a comparator coupled to receive the output of said detector and a reference voltage, wherein said comparator provides a comparator output indicative of the voltage difference between the output of said detector and the reference voltage, a power decrease circuit, responsive to said comparator output which decreases said output power in the course of a power decrease operation time when switching said voltage drive switching element, and a power increase circuit, responsive to said comparator output, which increases said output power in the course of a power increase operation time when switching said voltage drive element.

12. A gate drive circuit of a voltage drive switching element according to claim 11, wherein said voltage drive switching element comprises an IGBT.

13. A gate drive circuit of a voltage drive switching element according to claim 11 or 12, wherein the power decrease operation time of said power decrease circuit is larger than the power increase operation time of said power increase circuit.

* * * * *